United States Patent
Hammers

(10) Patent No.: US 11,463,043 B2
(45) Date of Patent: Oct. 4, 2022

(54) INTERNALLY REFLECTIVE SOLAR PANEL SYSTEM

(71) Applicant: David Lawrence Hammers, Wishon, CA (US)

(72) Inventor: David Lawrence Hammers, Wishon, CA (US)

( * ) Notice: Subject to any disclaimer, the term of this patent is extended or adjusted under 35 U.S.C. 154(b) by 64 days.

(21) Appl. No.: 16/740,260

(22) Filed: Jan. 10, 2020

(65) Prior Publication Data
US 2021/0091714 A1 Mar. 25, 2021

Related U.S. Application Data

(60) Provisional application No. 62/904,260, filed on Sep. 23, 2019.

(51) Int. Cl.
*H02S 30/10* (2014.01)
*H02S 20/23* (2014.01)
*H02S 40/22* (2014.01)

(52) U.S. Cl.
CPC ............ *H02S 30/10* (2014.12); *H02S 20/23* (2014.12); *H02S 40/22* (2014.12)

(58) Field of Classification Search
CPC .......... H02S 30/10; H02S 20/23; H02S 40/22; F21S 11/00; F21S 11/002; F21S 11/005; F21S 11/007; E04D 13/03; E04D 13/14
USPC ......................................................... 136/251
See application file for complete search history.

(56) References Cited

U.S. PATENT DOCUMENTS

| | | | | |
|---|---|---|---|---|
| 5,409,550 | A * | 4/1995 | Safir | H01L 31/052 136/246 |
| 8,459,851 | B2 * | 6/2013 | Wemmer | F21S 11/00 362/557 |
| 8,568,011 | B2 * | 10/2013 | Rillie | F21S 19/00 362/147 |
| 10,224,869 | B1 * | 3/2019 | Hammers | H02S 40/22 |
| 2012/0097212 | A1 * | 4/2012 | McCoy, Jr. | H02S 20/23 136/246 |
| 2016/0099362 | A1 * | 4/2016 | Bellette | H01L 31/0547 136/246 |
| 2018/0278203 | A1 * | 9/2018 | Hsu | H02S 30/00 |

FOREIGN PATENT DOCUMENTS

WO    WO-2009064258 A2 *  5/2009  ............. E04D 13/03

* cited by examiner

*Primary Examiner* — Bethany L Martin
*Assistant Examiner* — Kourtney R S Carlson
(74) *Attorney, Agent, or Firm* — Plager Schack LLP; Mark H. Plager; Alexis J. Saenz

(57) ABSTRACT

A solar panel system is assembled into a three-dimensional volume with the solar cell(s) positioned on an inward facing surface to collect sunlight and reflect sunlight from different angles as the sun passes overhead. Embodiments may be mounted into the interior of a building with a top end of the module being positioned on or proximate a roof surface and disposed to collect sunlight into the module interior below the roof line. Some embodiments may be pyramidal shaped. Outdoor mounting of the solar panel module includes embodiments that may be held in a frame and rail mounted system.

7 Claims, 12 Drawing Sheets

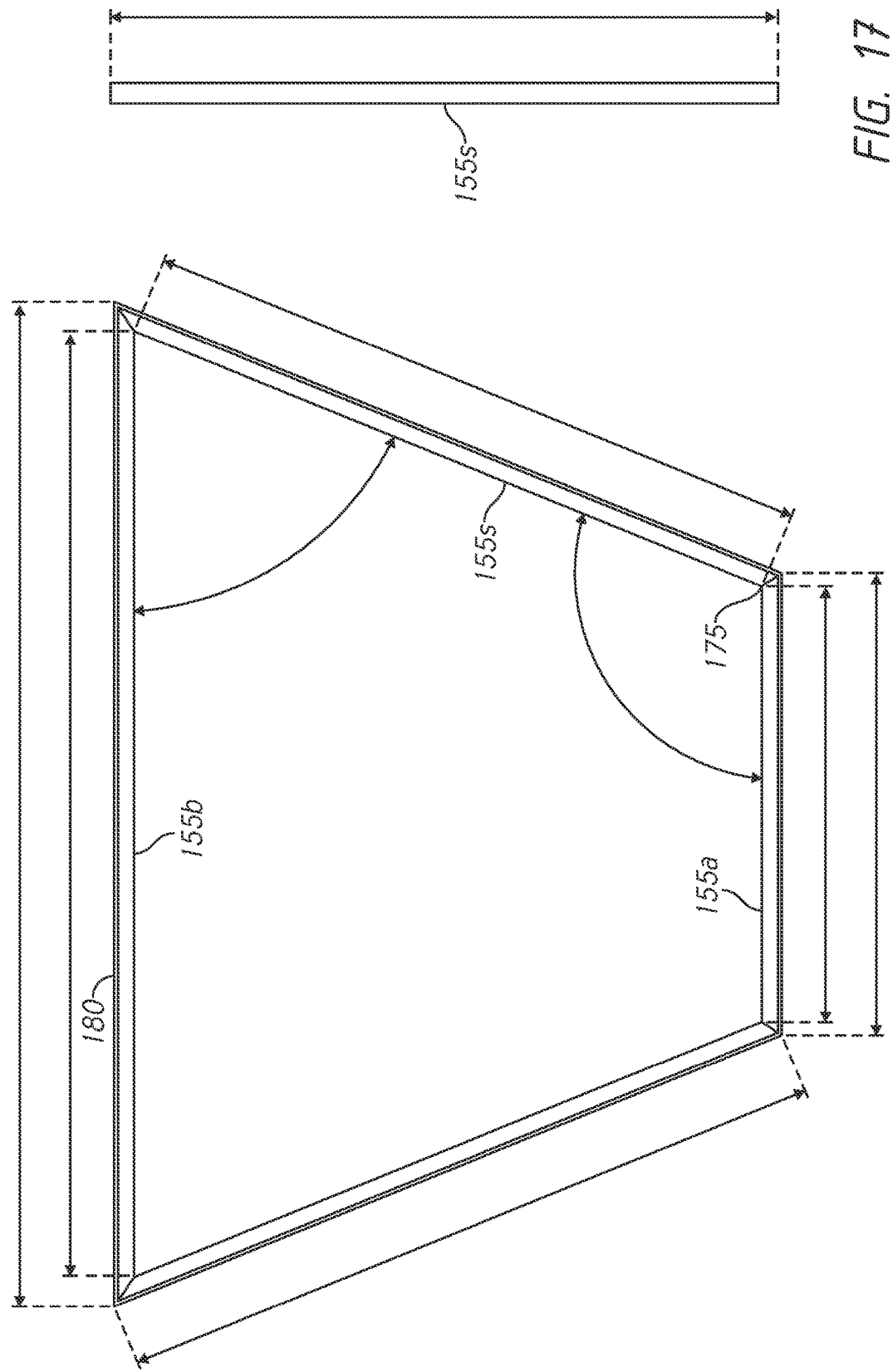

INTERNALLY REFLECTIVE SOLAR PANEL SYSTEM

CROSS-REFERENCE TO RELATED APPLICATIONS

This application claims benefit under 35 U.S.C. § 119(e) of U.S. Provisional Application having Ser. No. 62/904,260 filed Sep. 23, 2019, which are hereby incorporated by reference herein in their entirety.

BACKGROUND

The embodiments herein relate generally to renewable energy systems, and more particularly, to an internally reflective solar panel system.

Conventional solar power generating systems are rectangular and primarily two-dimensional panels of solar cells arranged in an inflexible array. Their positioning is generally planar. The efficiency in generating power of a conventional solar panel is limited by the angle of incidence from sun rays shining on the panels. When the sun is at steeper angles relative to solar panels, a lot of rays are lost due to reflection bouncing off the panel surface without absorption (scattering).

Generally, residential and commercial businesses mount solar panels on top of roofs to expose the panels to the sun passing by without interference from nearby sun obstructing objects such as trees and adjacent buildings. Some people find their visual appearance to be a detraction from a home's aesthetic appearance since arrays of panels jut out visibly along a rooftop.

As can be seen, there is a need for a solar system that may be efficient and, in some applications, provide a hidden feature to a home.

SUMMARY

According to one aspect of the subject technology, a solar panel system, is disclosed. The system comprises: a plurality of solar panels arranged to project upward at an obtuse angle from a common base or point, wherein: the arrangement of the plurality of solar panels define an open volume of space in an area between the plurality of solar panels, and each solar panel of the plurality of solar panels includes a face of solar cells facing inward into the open volume of space and toward at least one face of solar cells of other solar panels of the plurality of solar panels.

According to another aspect, solar panel system for recessed placement in a building's rooftop is disclosed. The system comprises: a frame including a plurality of frame members, wherein the plurality of frame members comprises sets of frame members projecting at an obtuse angle from a base; a plurality of solar panels attached to the sets of frame members projecting at the obtuse angle from the base, wherein: each of the plurality of solar panels are attached to adjacent joints defined by the plurality of frame members, the plurality of solar panels are arranged to project upward at the obtuse angle from the base, the arrangement of the plurality of solar panels define an open volume of space in an area between the plurality of solar panels, and each solar panel of the plurality of solar panels includes a face of solar cells facing inward into the open volume of space and toward at least one face of solar cells of other solar panels of the plurality of solar panels; and a mounting element attached to the frame and disposed to position a first open end of the frame to the rooftop and wherein the base of the frame, opposite the first open end of the frame, is positioned under the rooftop and recessed into an interior of the building.

BRIEF DESCRIPTION OF THE FIGURES

The detailed description of some embodiments of the present invention is made below with reference to the accompanying figures, wherein like numerals represent corresponding parts of the figures.

FIG. 16 is a front view of the frame system shown in FIG. 14.

FIG. 17 is an end view of one of the side wall frames of the frame shown in FIG. 14.

DETAILED DESCRIPTION OF CERTAIN EMBODIMENTS

The word "exemplary" is used herein to mean "serving as an example or illustration." Any aspect or design described herein as "exemplary" is not necessarily to be construed as preferred or advantageous over other aspects or designs.

In general, exemplary embodiments provide a solar panel system 100 (sometimes referred to generally as the "system 100") that provides increased efficiency in solar production within a volume of space. Aspects of the subject technology include single and multiple solar cells and multiple solar panels positioned within a three-dimensional frame. As will be appreciated, the system may generate more solar production than a conventional solar panel module given the same footprint on a square footage of space (for example, on a roof or on a rack).

Referring to FIGS. 1-4, in one aspect, embodiments of the system 100 may be inserted inside a roof R of a building so that solar generation may occur underneath the roofline. As may be appreciated, the system 100 includes a three-dimensional volume including, in some embodiments, an open-top or a transparent/translucent top 101 covering an opening and resembling the aesthetic of a skylight feature when installed on a building's roof. The cover 101 may work as a light guide to direct sunlight into the open volume of space of the system.

Figure 1:
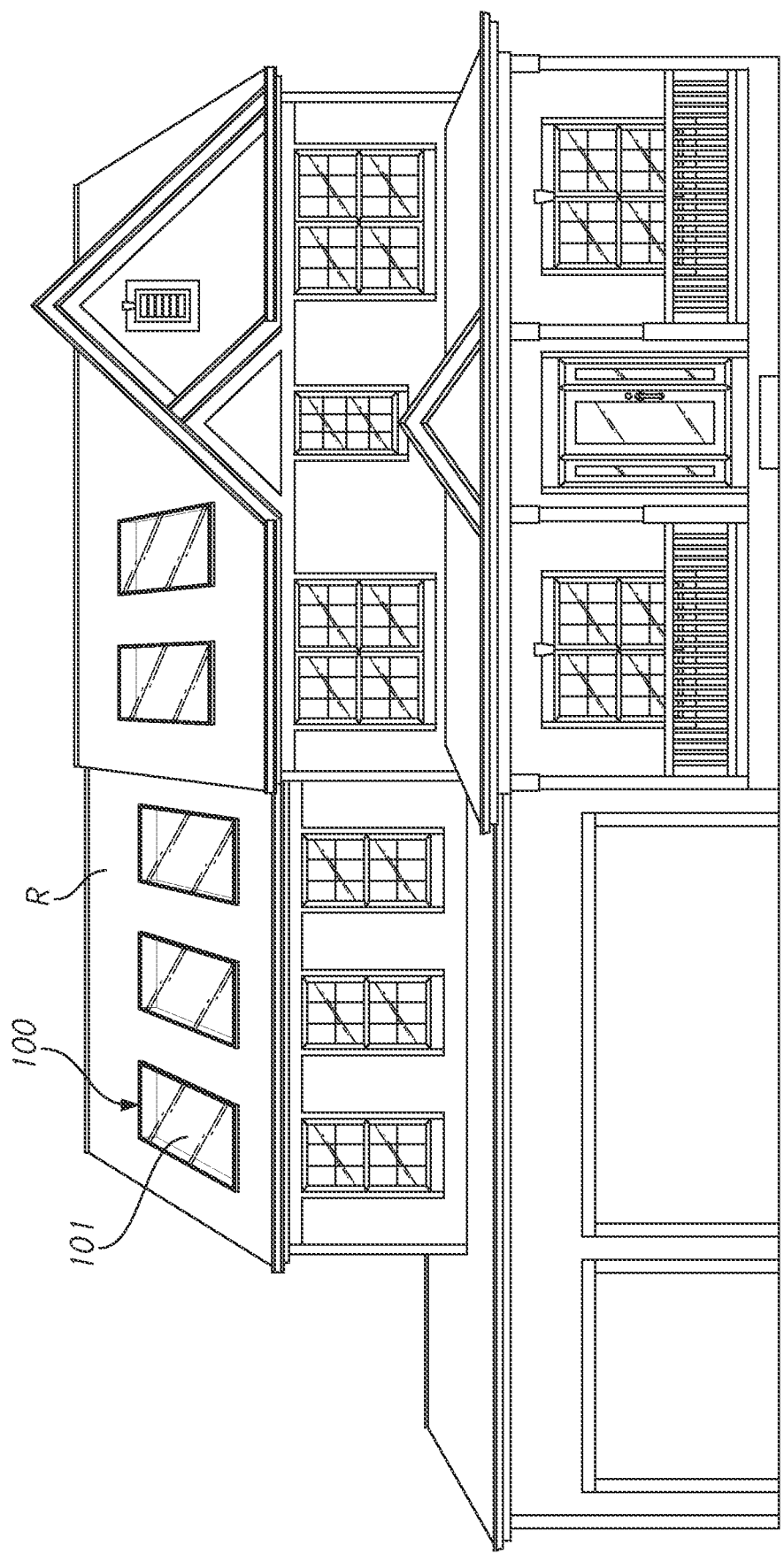
FIG. 1 is a front perspective view of a solar panel system integrated into the interior of a home's roof in accordance with an exemplary embodiment of the subject technology.
Figure 2:
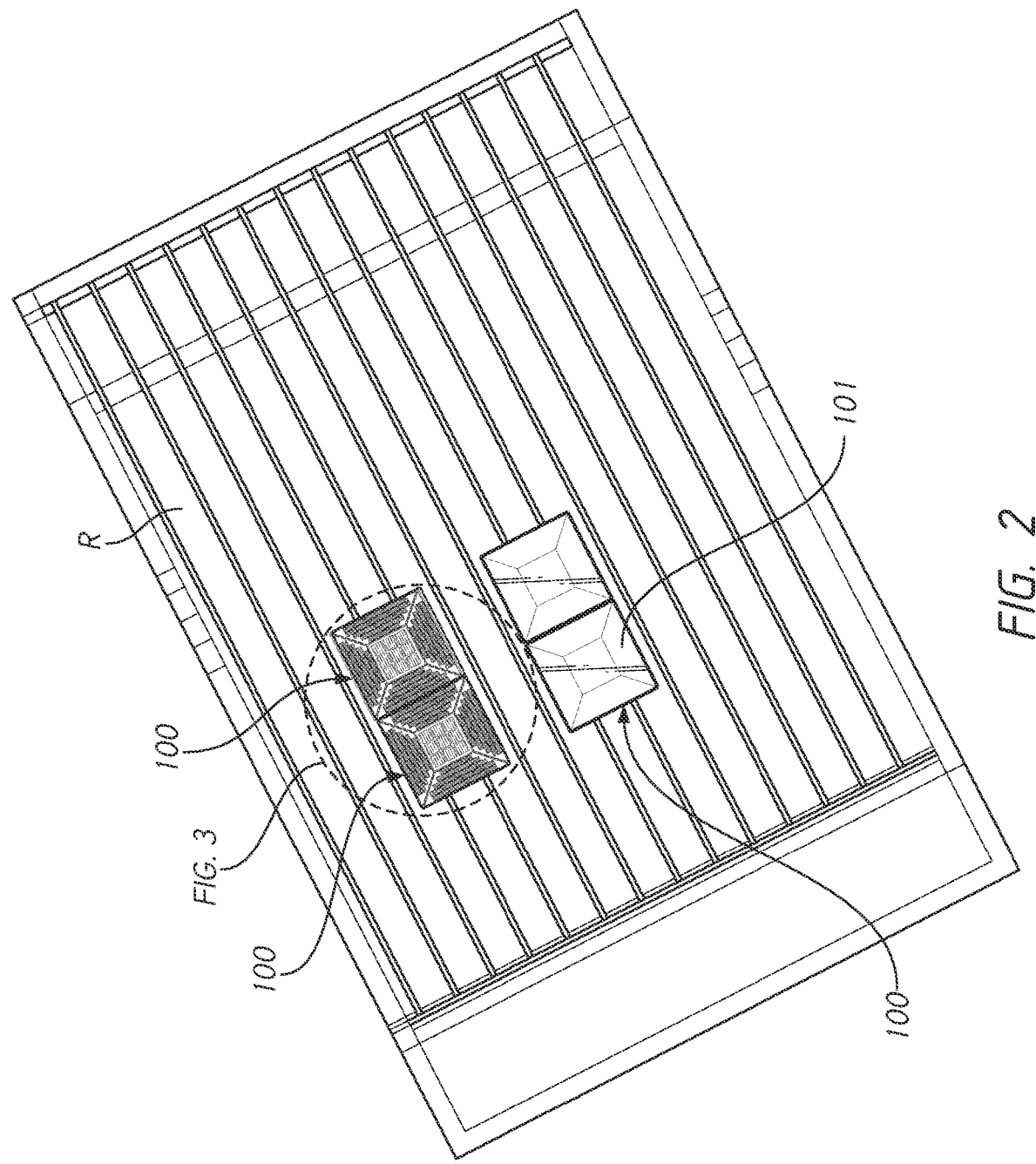
FIG. 2 is a top of a solar panel system integrated into the interior of a roof in accordance with an exemplary embodiment of the subject technology.

Aspects allow the system 100 to be inserted into a roof R so that the top of the system 100 may be approximately flush with the plane of the roof, but the bulk of the solar generating features are hidden from view. In some embodiments, portions of support beams under the roof may be removed to accommodate portions of the system 100 that extend into the roof interior. In some embodiments, a pair of the systems 100 may be installed adjacent to one another in abutment covered by the same glass cover 101 (see for example FIG. 2). The top cover 101 may be a single pane of glass covering multiple systems 100 (for example, as shown in FIG. 1) or may cover a single system 100 so that there are two top covers 101 for a pair of systems 100 in the same module (for example, as shown in FIG. 2). The footprint (area) on the roof R of a pair of adjacent systems 100 may be approximately the same footprint as a conventional solar panel (not shown).

The system 100, with or without the top cover 101, can also be used in an open environment. Held in a frame, the system 100 can be used either as device inside a building interior or wholly outside a building the for increased efficiency in solar production within a volume of space. The system 100 may collect solar energy (whether as an interior or an exterior device), by reflecting the energy entering within the module's volume amongst a plurality of solar cells and generating power from, in some cases the same or smaller roof space footprint as a conventional rectangular module.

Figure 3:
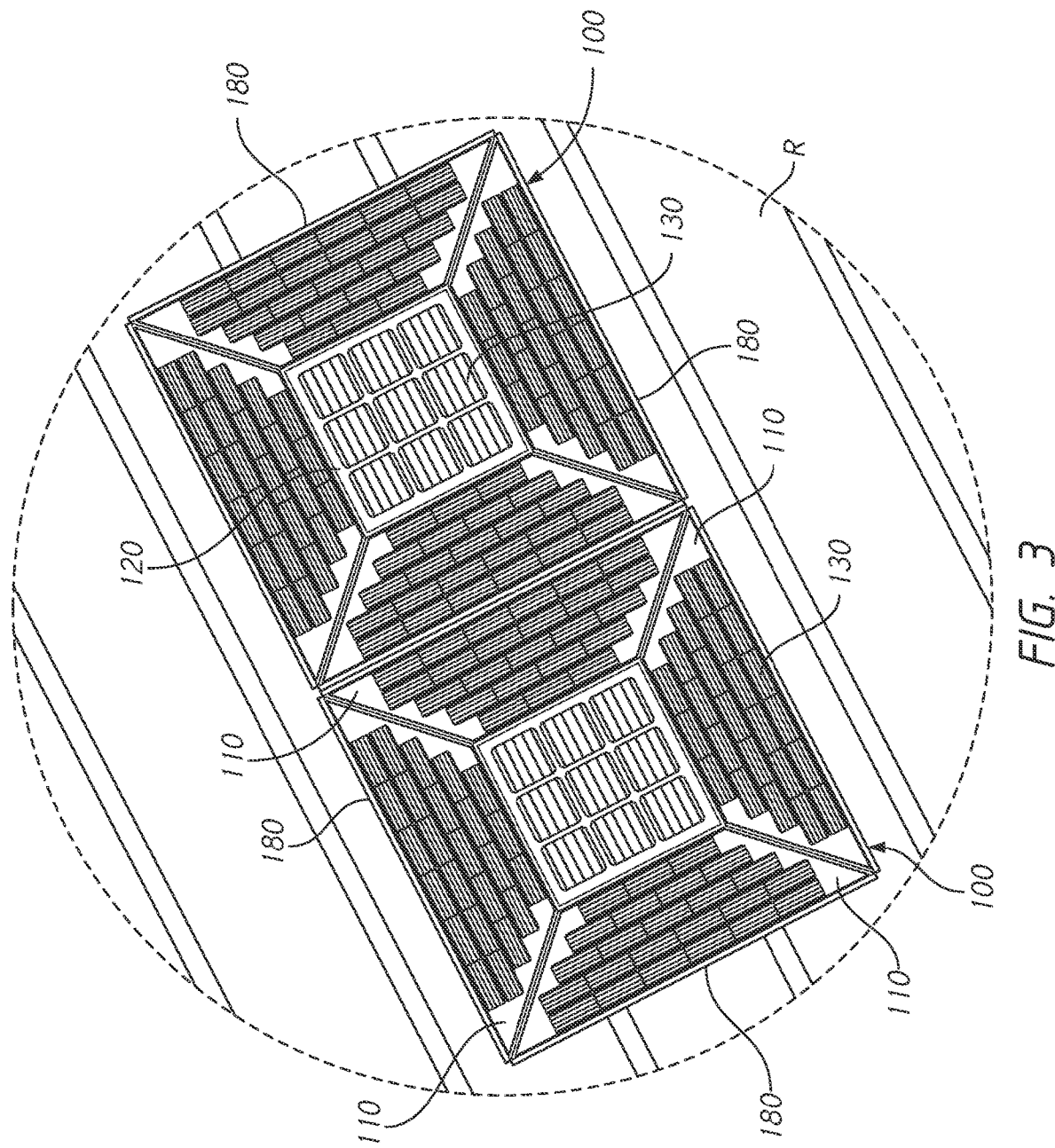
FIG. 3 is an enlarged view of the circle "FIG. 3" shown in FIG. 2.
Figure 4:
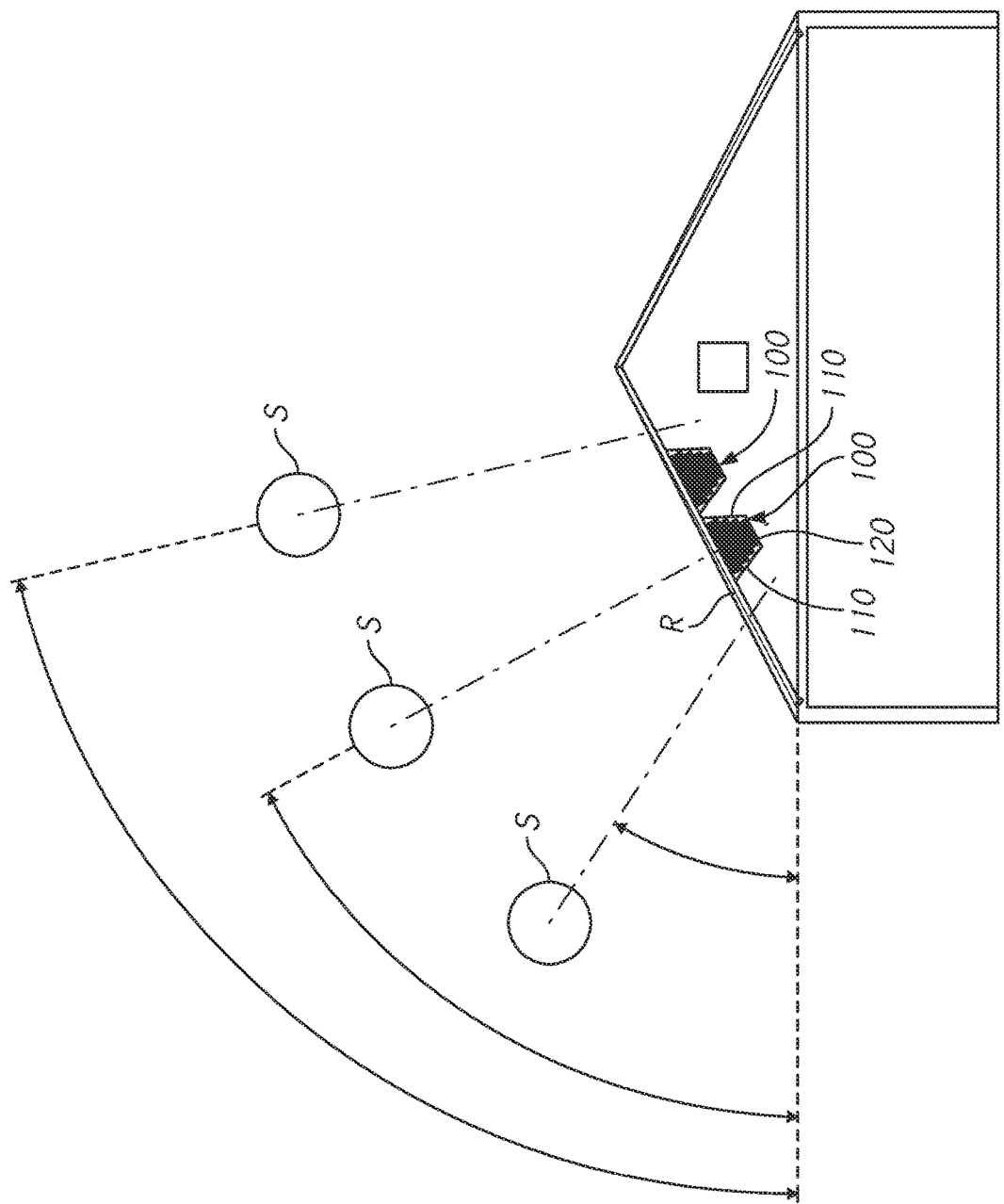
FIG. 4 is a schematic cross-sectional view of a building integrating solar panel systems into the interior of the roof according to embodiments and illustrating a path of the sun and exposure to the system.

Referring to FIGS. 3 and 4, a system 100 generally comprises a plurality of solar panels 110. The solar panels 110 include a face of solar cells 130. In an exemplary embodiment, the plurality of solar panels 110 may be side walls (sometimes referred to interchangeably as "side walls 110" or "solar panels 110") that project upward at an obtuse angle from a base wall 120 so that the open end of the system has a larger area between the top edges of a solar panel than the area of the base wall 120. The side walls may be arranged to define an open volume of space between each other, the base 120 and the open end of the system. In some embodiments, the base wall 120 may also comprise a face of solar cells 130. In an exemplary embodiment, the face of solar cells 130 of each side wall face inward toward one another (or at least toward one other face of solar cells 130). In another exemplary embodiment, the side walls may be arranged to form an inverted truncated, pyramid. In use, the open end of the pyramid is positioned to face up toward the sun S (see FIG. 4). The base 120 may be positioned in the interior of the building under the roof R.

In one aspect, it may be appreciated that the shape provided by the side walls 110 being at an obtuse angle helps secure the system 100 in place at the roof height. An opening in the roof may be sized so that the perimeter of the open end of the system 100 may be indexed to press fit against the edges of the opening in the roof. With the side walls 110 being angled inward toward the base 120, it can be seen that the system 100 may be slid through the opening in the roof without resistance until the open end side of the side walls 110 meet the edges of the roof opening. At which point, some embodiments may include elements to further secure and seal the top, open end of the system 100 to the opening of the roof. In other embodiments, it will be understood that other fastening means, including for example, supports that may couple the system 100 to the underside of the roof or to the roof's support beams.

Referring now to FIG. 4, an illustration of the Sun S passing over a building is shown. The Sun S is shown at three different positions. The first position is the one most left and represent the Sun rising. The middle position represents a time between morning and midday. The third (right hand most) position represents near midday. As will be appreciated, with the side wall solar panels 110 being at an obtuse angle, the system 100 may collect solar energy more efficiently as the Sun S traverses overhead in the sky. Instead of solar rays bouncing off a solar panel because the angle of incidence is too steep (as in conventional panels for example), at the first position, the side wall solar panels 110 are disposed to capture more of those rays because their angle reflects solar rays back into the interior of the system 100. The side wall solar panel 110 on the right side of the system 100 is positioned at an angle that creates an internal reflection toward the left side wall solar panel 110 and/or the base wall 120. At the second position, the Sun is nearly perpendicular to the base 120, which captures light approximately identically to a conventional solar panel (not shown) but may be more efficient because light that reflects (or scatters) from the base 120 may reflect onto the solar cells of the side wall solar panels 110. As may be further appreciated, embodiments with dual systems 100 in the same module may generate twice the efficiency of a conventional panel because twice as many solar panels 110 may be reflecting and capturing the typically lost solar rays.

Figure 5:
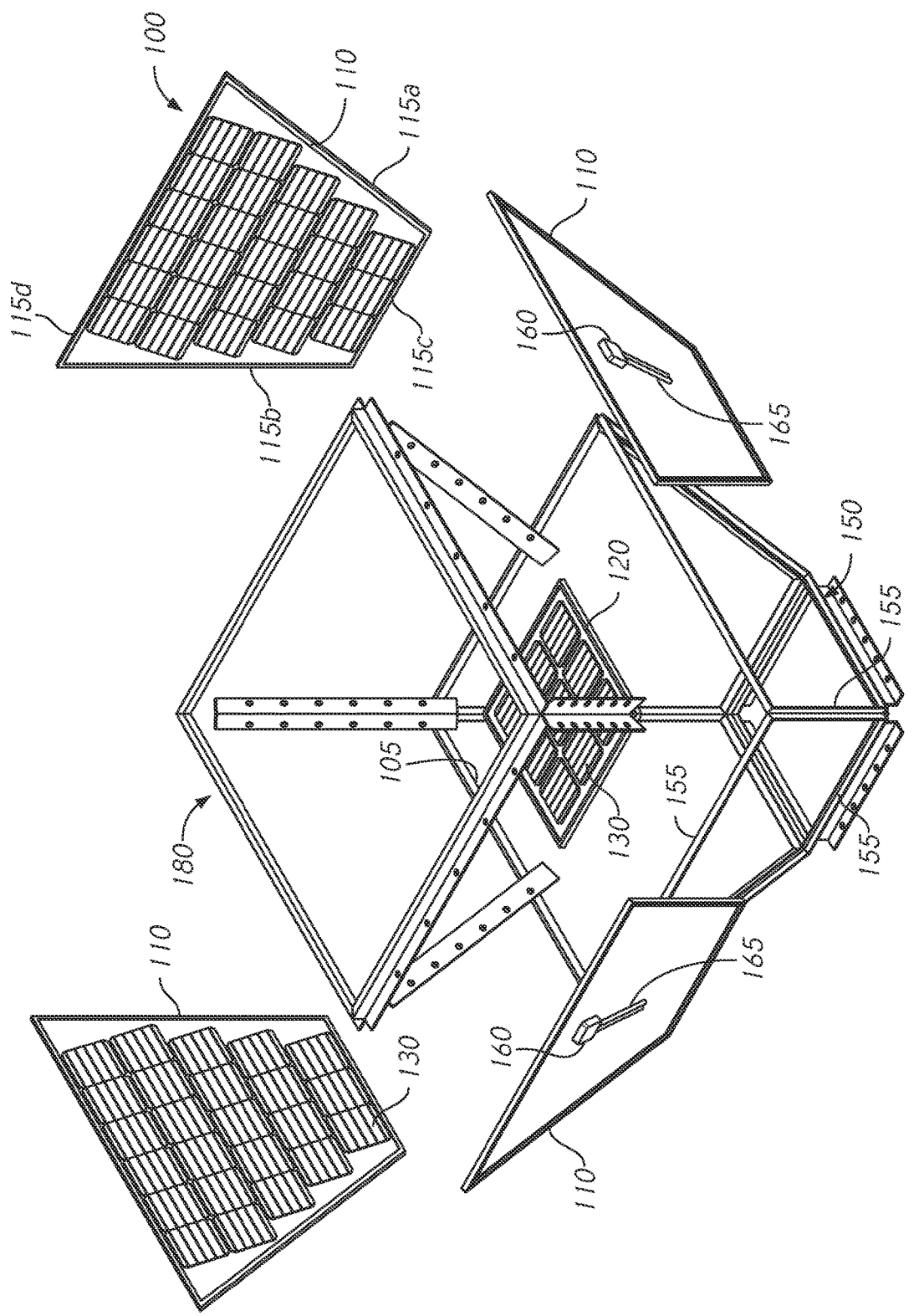
FIG. 5 is an exploded view of a solar panel system in accordance with an exemplary embodiment of the subject technology.
Figure 7:
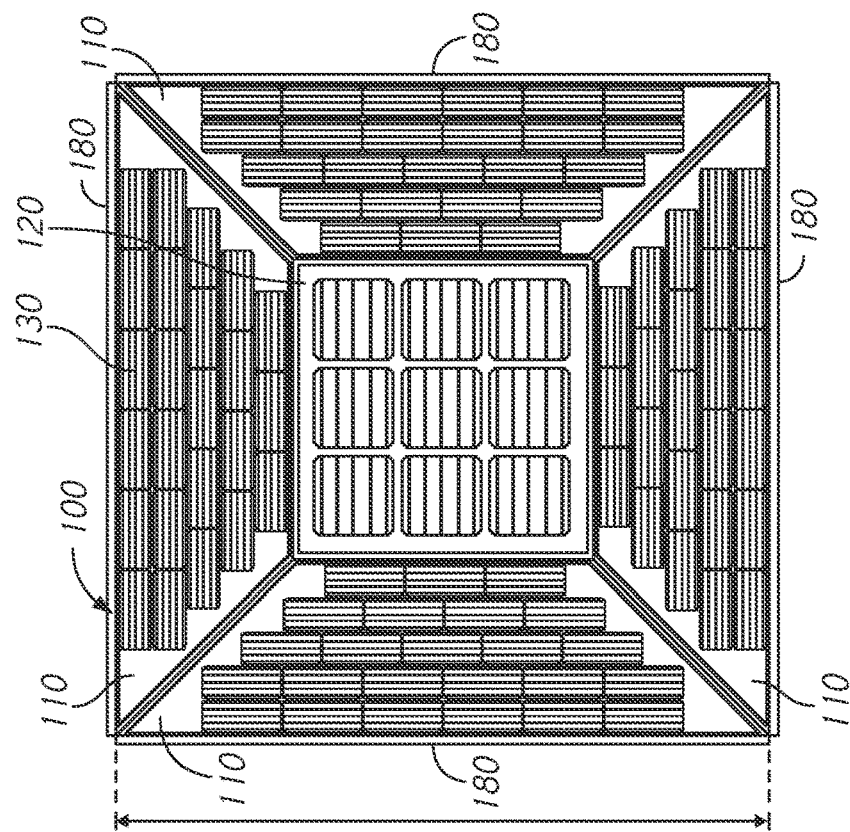
FIG. 7 is a top view of the solar panel system of FIG. 6.
Figure 6:
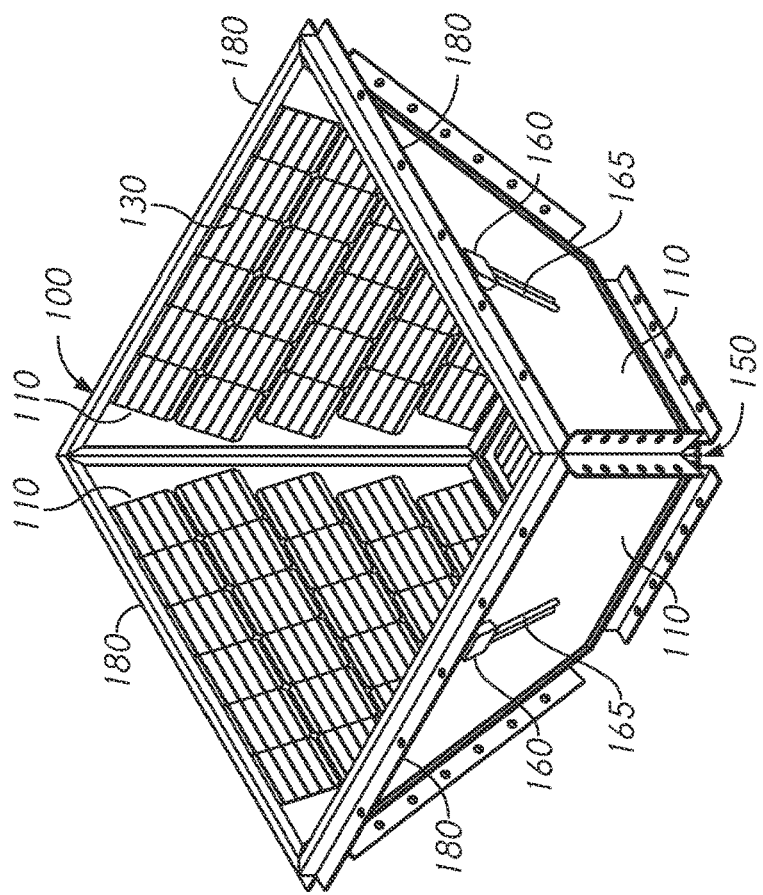
FIG. 6 is a top perspective view of a solar panel system in accordance with an exemplary embodiment of the subject technology.
Figure 9:
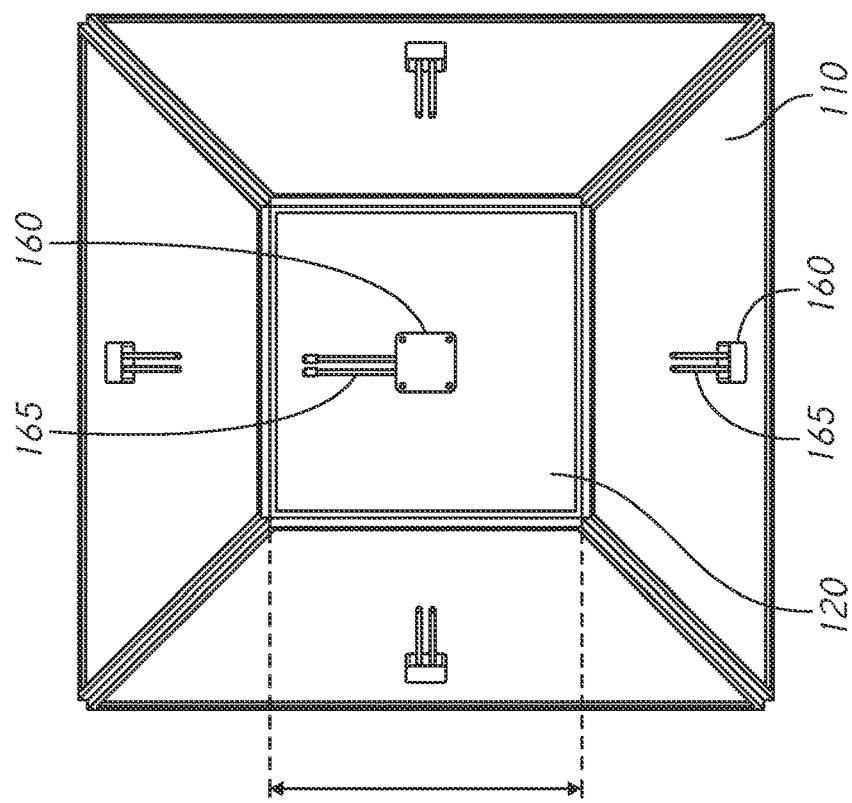
FIG. 9 is a bottom view of the solar panel system of FIG. 6.
Figure 8:
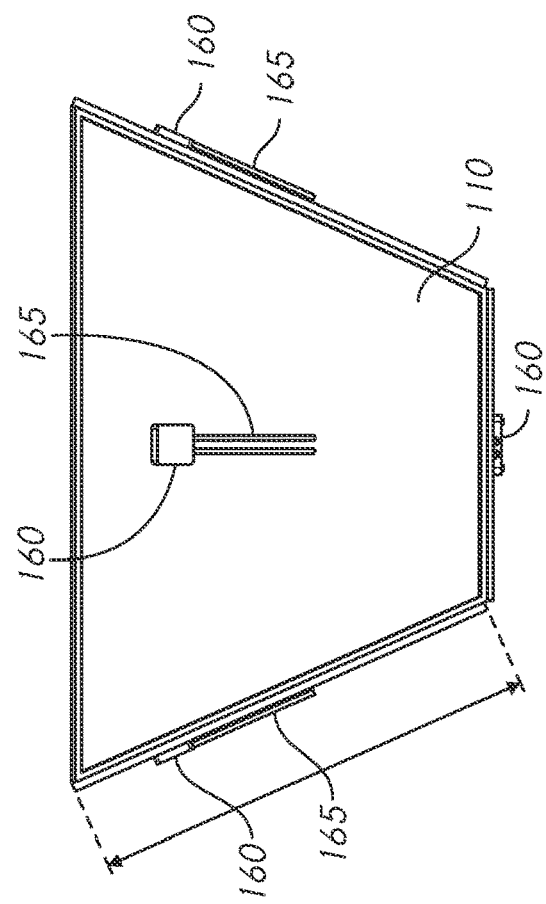
FIG. 8 is a side view of the solar panel system of FIG. 6.
Figure 11:
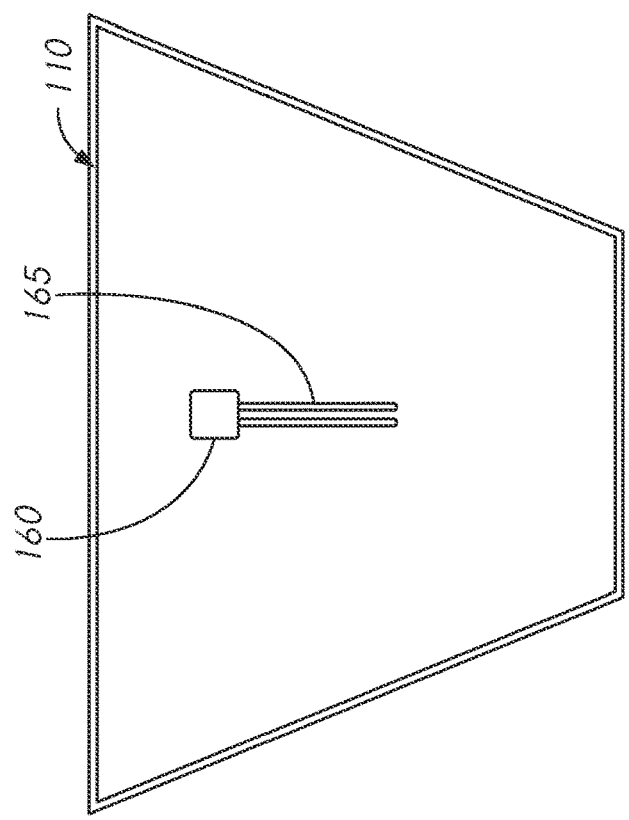
FIG. 11 is an exterior side view of the side wall of FIG. 10.
Figure 10:
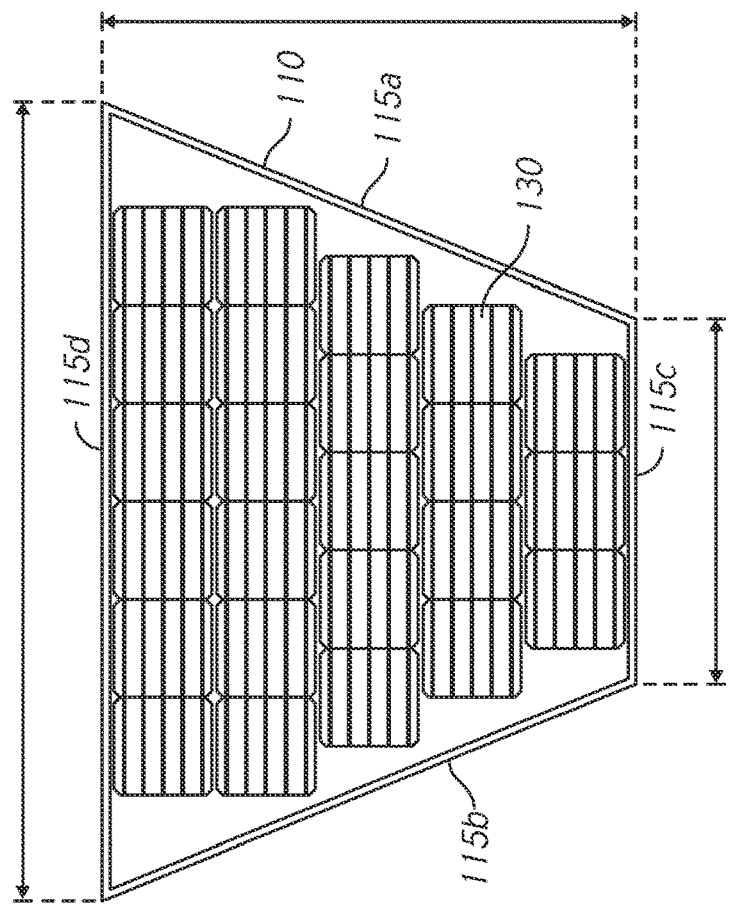
FIG. 10 is an interior side view of a side wall of the solar panel system of FIG. 6 in accordance with an exemplary embodiment of the subject technology.
Figure 13:
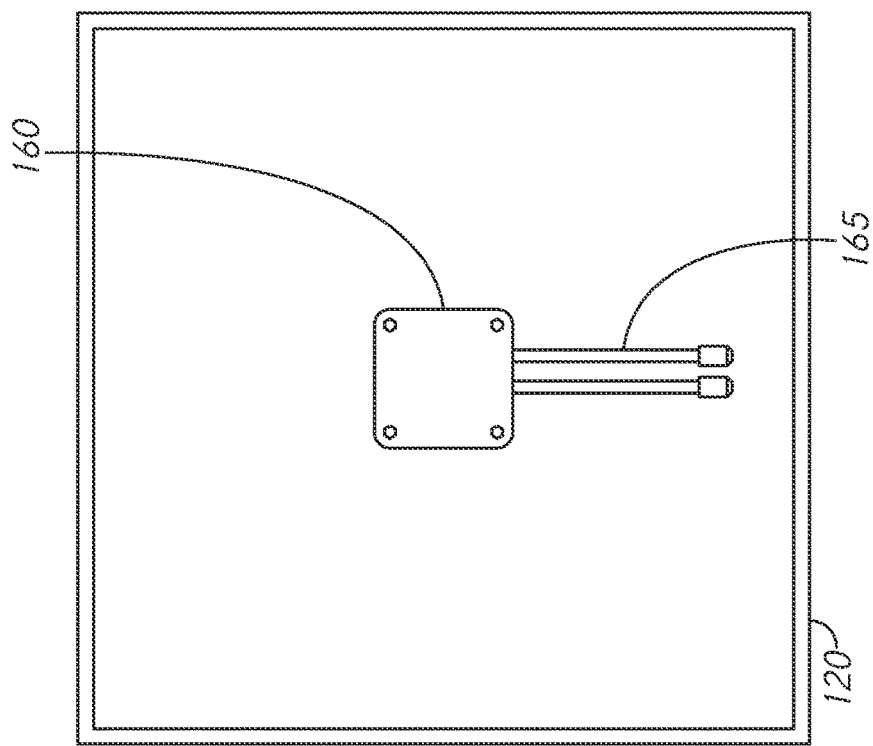
FIG. 13 is an exterior bottom view of the bottom side wall of FIG. 12.
Figure 12:
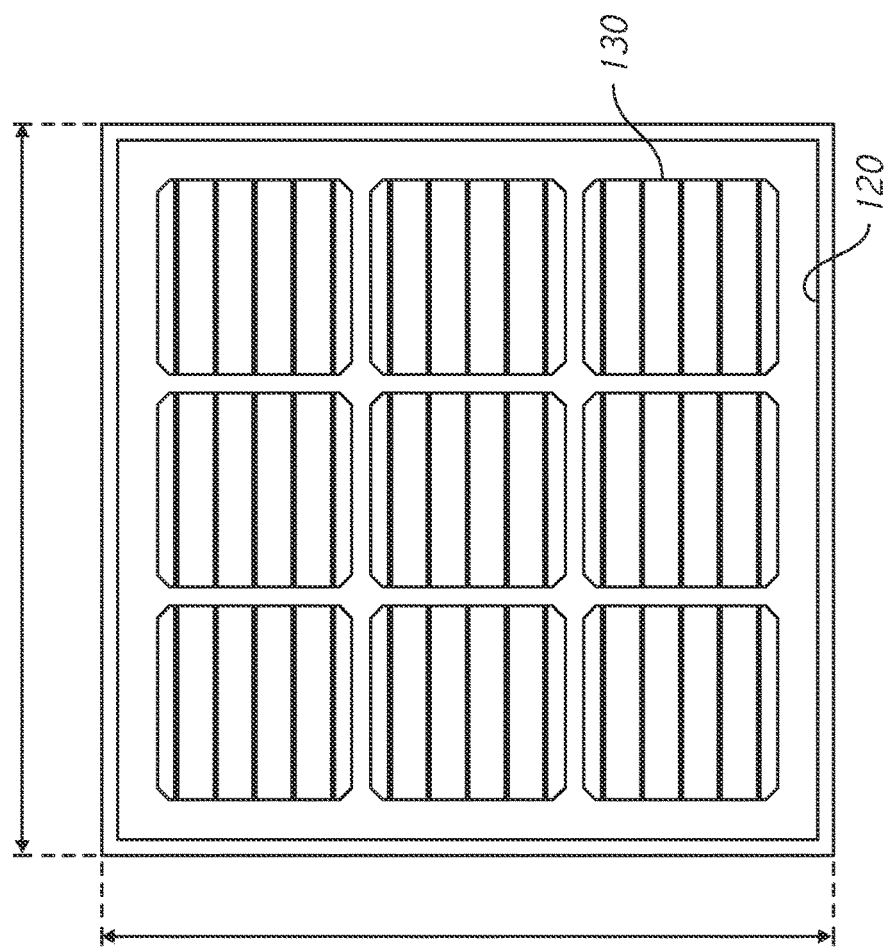
FIG. 12 is an interior top view of a floor side wall of the solar panel system of FIG. 6 in accordance with an exemplary embodiment of the subject technology.
Figure 15:
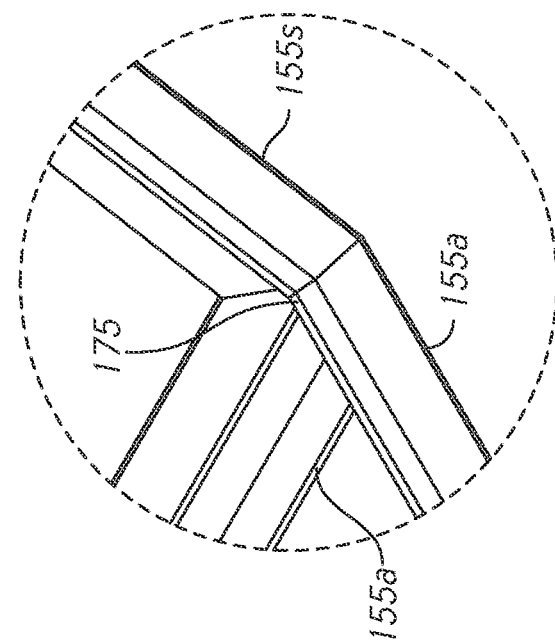
FIG. 15 is an enlarged view of the circle "FIG. 15" shown in FIG. 14.
Figure 14:
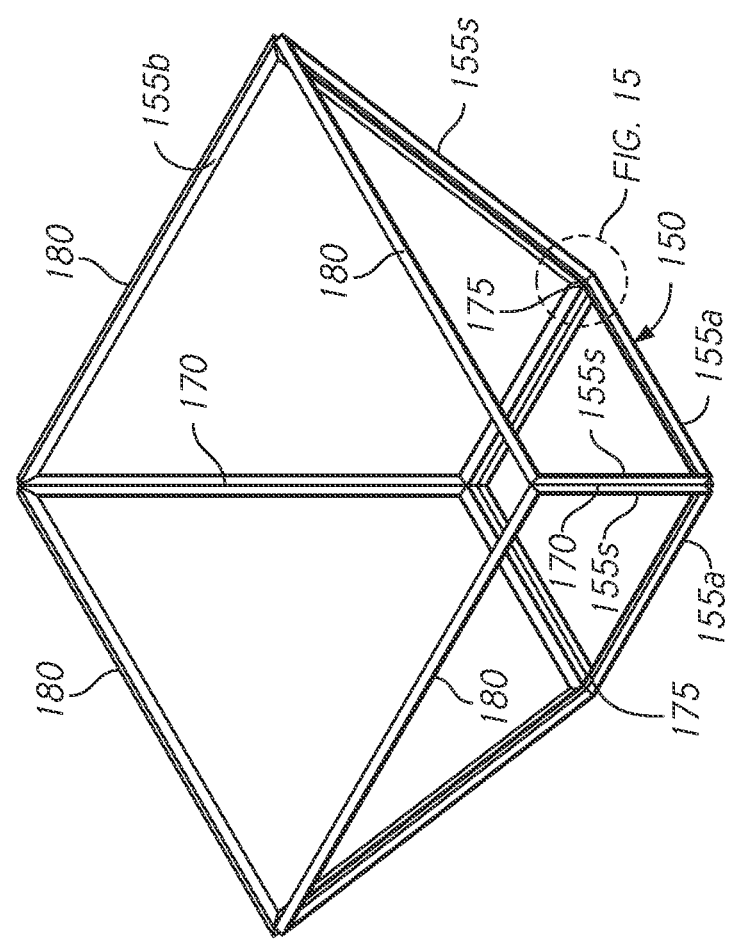
FIG. 14 is a top perspective view of a frame system of a solar panel system in accordance with an exemplary embodiment of the subject technology.
Figure 19:
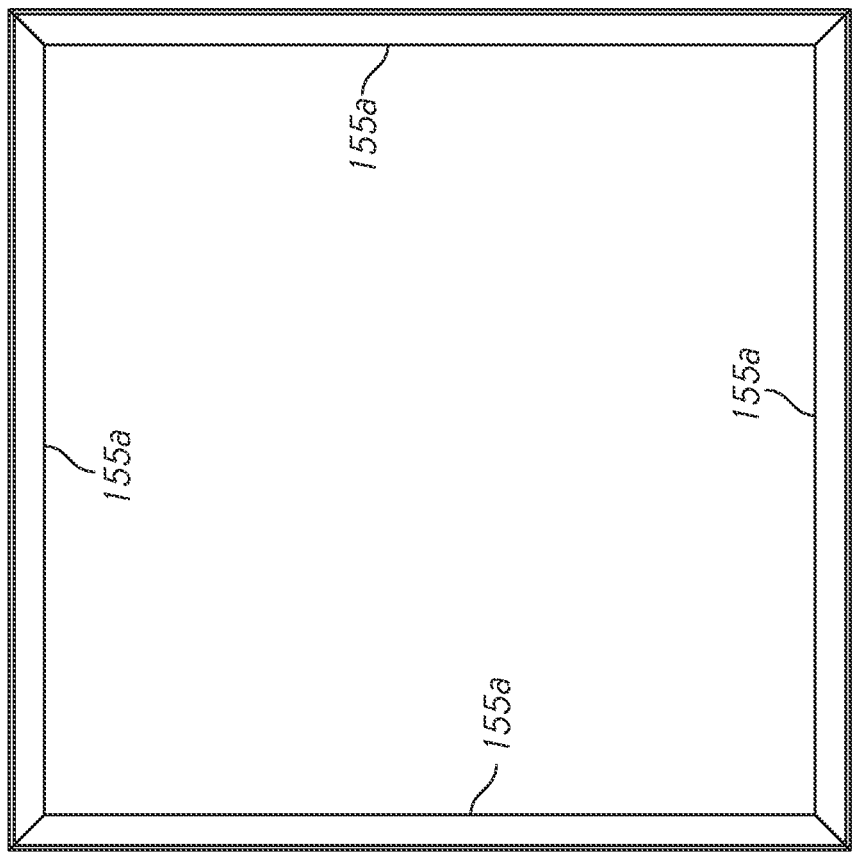
FIG. 19 is a bottom view of the bottom side wall of the frame system of FIG. 14.
Figure 18:
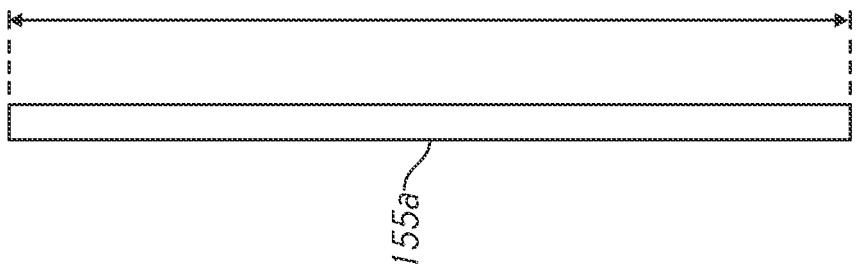
FIG. 18 is an end view of a bottom side wall of the frame system of FIG. 14.

Referring now to FIGS. 5-19, aspects of the solar panel system 100 are described in more detail according to exemplary embodiments. In an exemplary embodiment, the system 100 may include a frame 150. The frame 150 may comprise frame elements 155 which may be for example, bars with slots for receipt of the edges of side walls 110. In an exemplary embodiment, the frame elements 155 may be arranged to form a three-dimensional polygon with a slant aspect associated with the side walls 110. For example, the frame 150 may be a truncated square pyramid with the open end representing the base and the bottom (which holds the bottom wall 120) representing the truncated apex. During use, it will be understood that the apex may be inverted so that the bottom wall 120, while being referred to as the "base" is the smaller of the two ends usually associated with the apex. The side wall solar panels 110 may be trapezoidal. In the embodiment shown, the side walls 110 may include slanted side edges 115a and 115b, a smaller or apex edge 115c, and a larger or base edge 115d (see FIGS. 5 and 10). The side edges 115a and 115b may fit into slots of frame side elements 155s (see FIGS. 14-17). The edge 115d may fit into a slot of frame base element 155b which defines the plane of the open end of the volume. The edge 115c may fit into a slot of frame apex elements 155a. The frame apex elements 155a may form a generally square frame for the bottom wall 120 (see FIGS. 18-19). However, it will be understood that the frame apex elements 155a may form other polygonal frames (for example, a triangle which will define a triangular pyramid or more than 5-sided shapes to define other types of pyramids). The intersection of one frame side element 155s with another frame side element 155s may be a joint 170. The intersection of the joint 170 with frame apex elements 155a may be a joint 175. The angle defined by the joint 175 may be obtuse as shown in FIG. 16 where the frame side element 155s angles away from the frame apex element 155a greater than ninety degrees. The side walls 110 may project at an angle outward (or away) from their respective joint 175 with the bottom wall 120 so that the larger edge 115d of the side wall 110 is farther from the center of the interior volume than the smaller edge 115c of the side wall 110. In an exemplary embodiment, the assembly of the side walls 110 to the bottom wall 120 may form an open volume truncated pyramid (see for example, FIG. 6), with the bottom wall 120 being smaller in area than the plane of the open-ended entry 105 of the system (assuming the cover is not in place).

In some embodiments, as an example of a mounting element, the frame 155 may include one or more flanges 180 projecting perpendicularly from various frame elements (for example, a top frame support, a side frame support, or a base frame support). The flange 180 may be configured to mount the frame 155 to a support structure of the house (for example, a beam or truss) to hold the system 100 in position within the roof interior. While flanges 180 are shown on each of the top, sides, and base, it will be understood that in some embodiments flanges 180 may be present only on the parts of the frame 150 that will be attached to a supporting structure.

Additionally, some embodiments may include a junction box 160 on an exterior surface of each side wall 110 (see FIGS. 5, 6, 8, 9, and 11). DC connections 165 may be included on the back side of each wall 110. These DC connections 165 may be for example, industry standard MC4 male and female connectors. If required, or specifically called for, other connectors can be used such as Amphenol, SAE, or other types of solar panel connectors. The length of the extension cable (typically PV wire) from the back of each solar panel to the connectors can vary from 1 foot to 100 feet or more depending on the required application. The DC connections 165 may be connected to the junction box 160 to connect to a common bus that leads to a load (not shown) or a grid connection (not shown). In embodiments where the bottom wall 120 also includes solar cells 130, the bottom wall 120 may include a junction box 160 and DC connections 165 (see FIGS. 9, 12, and 13).

The solar cells 130 may be monocrystalline, polycrystalline, thin film, or any industry accepted type of solar cell which ultimately makes up a solar panel. The solar panels 110 may be wired in either a string configuration, by using optimizers, or by using micro-inverters to achieve industry standard DC solar wattage output. The DC wattage output can be used directly in some applications or by using, typically, an inverter the DC solar wattage output can be converted to AC power.

The wattage output of the system may be dependent on the positioning of the system 100 with respect to the radiance of the Sun S (see FIG. 4) from any given perspective. The low range of DC wattage output in one example configuration may be rated at about +/−250 watts. The high range DC wattage output may be rated at about +/−500 watts. Positioning of the system with respect to an Eastern exposure, Southern exposure, Western exposure or Northern exposure will affect the DC wattage output. The Earth's latitude and longitude for each system 100 installed will also have an effect on the DC wattage output.

The solar panels in a system 100 may generally face inward into the volume of space and toward one another on their respective side walls 110 and toward the solar cells 130 of the other solar panels while also facing partially upward into the volume of space and toward the light source. The bottom wall 120 may include solar cells which face generally upward toward the entry into the volume of space. In operation, light passing through the entry of the system 100 may be incident on one or more side walls 110 and/or the bottom wall 120. The light may reflect off an initial wall onto another wall in the system 100 until the light that is not absorbed by solar panels in the system interior escapes from the volume, if at all. As will be appreciated, the angles of the side walls 110 help create multiple internal reflections within the interior's volume. Accordingly, the efficiency in capturing solar energy in the same footprint is increased over a conventional two-dimensional panel. In addition, embodiments recessed into a roof provide improved efficiency in capturing solar energy while presenting an aesthetic and inobtrusive appearance to one's rooftop.

In some embodiments, the system framing 150 may be attached indoors to engineered structural attachments of a building structure or outdoors to a rack and rail solar mounting hardware system.

Some embodiments may include vents or ports for wet or inclement weather in outdoor applications with the installation of ports at the bottom of the device for water drainage.

Persons of ordinary skill in the art may appreciate that numerous design configurations may be possible to enjoy the functional benefits of the inventive systems. Thus, given the wide variety of configurations and arrangements of embodiments of the present invention the scope of the present invention is reflected by the breadth of the claims below rather than narrowed by the embodiments described above.

Terms such as "top," "bottom," "front," "rear," "above," "below" and the like as used in this disclosure should be understood as referring to an arbitrary frame of reference, rather than to the ordinary gravitational frame of reference. Thus, a top surface, a bottom surface, a front surface, and a rear surface may extend upwardly, downwardly, diagonally, or horizontally in a gravitational frame of reference. Similarly, an item disposed above another item may be located above or below the other item along a vertical, horizontal or diagonal direction; and an item disposed below another item may be located below or above the other item along a vertical, horizontal or diagonal direction.

What is claimed is:

1. A solar panel system for recessed placement in a building's rooftop, comprising:
   a frame including a plurality of frame members, wherein the plurality of frame members comprises sets of frame members projecting at an obtuse angle from a base;
   a plurality of solar panels attached to the sets of frame members projecting at the obtuse angle from the base, wherein:
      each of the plurality of solar panels are coupled to joints defined by the plurality of frame members,
      the plurality of solar panels are arranged to project upward at the obtuse angle from the base,
      an arrangement of the plurality of solar panels define an open volume of space in an area between the plurality of solar panels, and
      each solar panel of the plurality of solar panels includes a face of solar cells facing inward into the open volume of space and toward at least one face of solar cells of other solar panels of the plurality of solar panels; and a mounting element coupled to the frame and configured to:

position a first open end of the frame, parallel and flush to the rooftop and, position the base of the frame, opposite the first open end of the frame, parallel to the first open end, under the rooftop and recessed into an interior of the building.

2. The solar panel system of claim 1, wherein the base includes a first area that is less than an area of the first open end of the frame.

3. The solar panel system of claim 2, wherein the base includes an additional solar panel, wherein the additional solar panel is not one of the plurality of solar panels, and a face of solar cells of the additional solar panel faces the first open end of the frame.

4. The solar panel system of claim 1, wherein the mounting element comprises a flange configured to mount to a supporting structure of the roof.

5. The solar panel system of claim 3, wherein the arrangement of the plurality of solar panels is arranged to define an inverted pyramid while the solar panel system is in operation.

6. The solar panel system of claim 5, wherein the inverted pyramid is a truncated pyramid.

7. The solar panel system of claim 6, wherein the arrangement of the plurality of solar panels includes four solar panels for side walls of the inverted pyramid, and solar energy received in the open volume of space onto one of the side wall solar panels reflects onto the additional solar panel of the base.

* * * * *